United States Patent

[11] 3,578,913

[72] Inventor Pieter Johan Ufkes
Emmasingel, Eindhoven, Netherlands
[21] Appl. No. 728,701
[22] Filed May 13, 1968
[45] Patented May 18, 1971
[73] Assignee U.S. Philips Corporation
New York, N.Y.
[32] Priority June 9, 1967
[33] Netherlands
[31] 6708111

[54] TRANSISTOR AMPLIFIER WITH NEGATIVE FEEDBACK VOLUME CONTROL
7 Claims, 2 Drawing Figs.

[52] U.S. Cl. .......... 179/1
[51] Int. Cl. .......... H03f 3/00
[50] Field of Search .......... 179/1 (F), 1 (A), 1 (VOL); 330/26, 27, 28, 86

[56] References Cited
UNITED STATES PATENTS

| | | | |
|---|---|---|---|
| 3,140,348 | 7/1964 | Laughter .......... | 179/1 |
| 3,382,321 | 5/1968 | Lybarger et al. .......... | 179/1 |
| 3,399,276 | 8/1968 | Wolff .......... | 179/1 |

*Primary Examiner*—Kathleen H. Claffy
*Assistant Examiner*—Douglas W. Olms
*Attorney*—Frank R. Trifari

ABSTRACT: A hearing aid amplifier comprising a capacitor and a microphone in series across the amplifier input terminals and a volume control potentiometer in shunt with the microphone. A resistor connected between the amplifier output terminal and the movable arm of the potentiometer provides, at the input terminals, a DC negative feedback voltage and an AC negative feedback signal that varies with the adjustment of the Pot arm to provide volume control for the hearing aid.

PIETER J.UFKES INVENTOR.
BY
AGENT

TRANSISTOR AMPLIFIER WITH NEGATIVE FEEDBACK VOLUME CONTROL

The present invention relates to an improved volume control for a transistor amplifier suitable for use in hearing aids. A hearing aid generally comprises a transistor amplifier which is coupled with an input signal source, more particularly a microphone, which is bridged by a volume control means. The amplifier is provided with a DC negative feedback leading from the output of the amplifier to its input through a resistor. The signal source is connected in series with a capacitor across the input of the transistor amplifier. Such a device has been described, for example, in the periodical "Audio" of May 1960, page 59 and in FIG. 5 of U.S. Pat. No. 3,030,586.

The invention has for an object to provide a device of the said kind in which an adjustment to provide lower amplification by means of the volume control involves an increase in the effective negative feedback so that distortion and noise also are suppressed. Various attempts have been made to achieve such a "loss-free negative feedback" in transistor amplifiers. For example, the German "Auslegeschrift" 1,135,048 provides a solution in which an adjustable AC negative feedback is produced at the input of the transistor amplifier by means of an adjustable resistor. A DC negative feedback voltage which is independent of the position of the adjusting resistor is then rendered effective and brings about the stabilization of the operating point of the transistor amplifier. This known device has the disadvantage that the negative feedback voltage is produced in series with the signal source at the input of the transistor amplifier so that an adjustment to a higher negative feedback and hence to a lower amplification, involves an increase in the input impedance of the transistor amplifier. This in turn results in the signal source being less strongly attenuated so that its natural frequency characteristic curve exerts a greater influence on the overall frequency characteristic curve of the amplifier. For example, in the case of a normal attenuation by the input of the transistor amplifier in the position of maximum amplification of 50 KΩ, the reproduction characteristic curve of the microphone used in practice exhibits peaks at 2 kc/s and 3.8 kc/s. In the absence of attenuation, these peaks shift to 1.6 kc/s and 3.6 kc/s and are increased by 6 dB. The telephones used in practice also have a strongly frequency-dependent impedance. Moreover, in practice, the said capacitor cannot be chosen sufficiently large so that, within the frequency range to be amplified, considerable phase shifts in the negative feedback across the series combination of the said capacitor and the said adjusting resistor are eliminated. This has an unfavorable influence both on the frequency characteristic curve and on the stability of the circuit arrangement.

An object of the invention is to avoid these disadvantages and is characterized in that the said resistor engages a movable contact of the said volume control means.

The invention will be described with reference to the accompanying drawing, in which.

Figure 1:
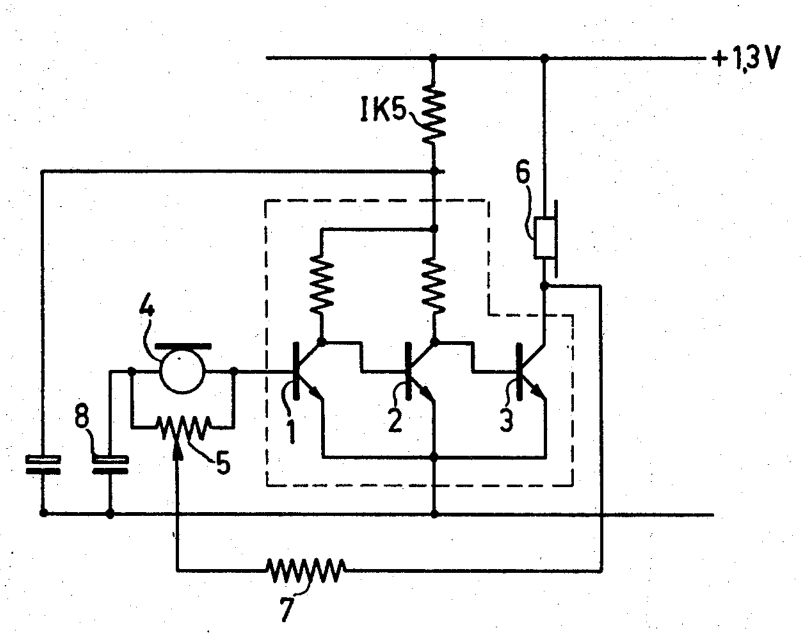
FIG. 1 shows an embodiment according to the invention.

The embodiment of FIG. 1 shows a transistor amplifier comprising transistors 1, 2 and 3 connected in cascade arrangement across the terminals of the DC voltage supply, more particularly to an integrated circuit of the type OM 200. The input of the transistor amplifier is connected to a capacitor 8 connected in series with a microphone 4, which constitutes the signal source, which in turn is bridged by a volume control potentiometer 5. The output of the amplifier 1, 2, 3 is connected to an output impedance, in this case a telephone 6, from which a DC negative feedback path including a resistor 7 returns to the input of the transistor amplifier 1, 2, 3 a DC negative feedback voltage that stabilizes the operating point of the transistor amplifier.

According to the invention, the negative feedback resistor 7 engages the movable contact of the volume control 5. In the extreme left position of the movable contact, the effective DC negative feedback is quite analogous to that in the known device described in the said periodical "Audio." When the movable contact is displaced to the right, this DC negative feedback is maintained and at the same time an AC negative feedback is produced at the input of the transistor amplifier 1, 2, 3. As distinct from the device described in the said "Auslegeschrift," this negative feedback becomes operative at least partly parallel to the signal source (microphone 4). In the extreme right position of the movable contact, in which the effective negative feedback is a maximum and hence the amplification is a minimum, the negative feedback is operative entirely in parallel with the source 4. Consequently, the input impedance of the amplifier 1, 2, 3 decreases with increasing negative feedback so that undesired oscillations of the microphone 4 are attenuated. This input impedance remains substantially ohmic, which favorably influences the stability of the circuit arrangement.

In a practical example, the microphone used had a DC resistance of 900 Ω and an AC resistance of kΩ at a frequency of 1000 c/s. The volume control 5 had a value of 25 kΩ, the resistor 7 had a value of 180 to 470 kΩ and the capacitor 8 had a value of 4.7 μF. The telephone 6 had a DC resistance of 500 Ω and an AC resistance of 1500 Ω at a frequency of 1000 c/s.

Figure 2:
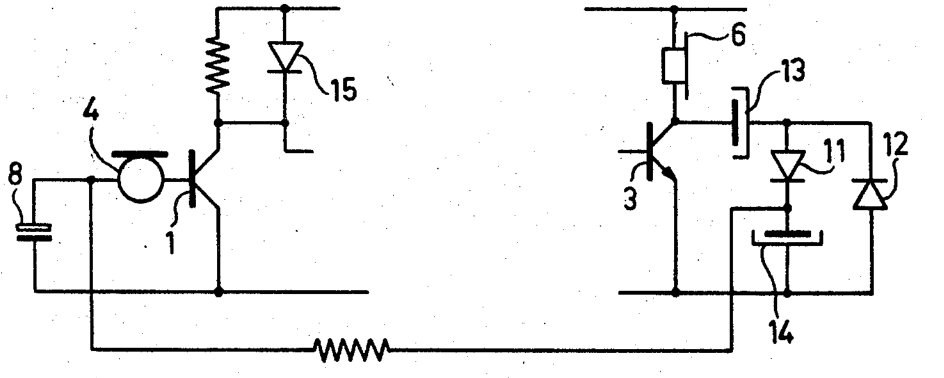
FIG. 2 shows an improved modification of the embodiment of FIG. 1.

FIG. 2 shows a modification of the invention in which the circuit elements corresponding to those of FIG. 1 are denoted by the same reference numerals. The output signal at the telephone 6 is rectified by means of a double diode circuit comprising diodes 11 and 12 and capacitors 13 and 14. Thus, an automatic gain control voltage is produced across the capacitor 14 and which is then conducted back to the input of the amplifier. This voltage may be applied, for example, to the movable contact of the volume control 5 of FIG. 1 or to the capacitor 8 of FIG. 2. The polarity of this automatic gain control signal is chosen so that the transistor increases its conduction as the control signal increases so that a rectifier 15, connected in the collector circuit of this transistor, has a lower dynamic resistance, which involves a decrease in the overall amplification. Thus, when the signal abruptly increases, undesired control fluctuations which may occur in such a device with opposite pass directions of the rectifiers 11, 12 and 15 can be avoided.

I claim:

1. A transistor amplifier for use in a hearing aid comprising, a source of AC signal to be amplified, volume control means having a movable contact arm, means connecting said volume control means in parallel combination with said signal source, a capacitor, means connecting said capacitor in series with said parallel combination across the input terminals of the amplifier, a resistor, and means connecting said resistor between an output terminal of the amplifier and the movable contact arm of said volume control means to provide at the input terminals of the amplifier, a DC negative feedback voltage and a variable negative feedback signal that is dependent upon the position of said movable arm.

2. An amplifier as claimed in claim 1 wherein said signal source comprises a microphone and said volume control means comprises a potentiometer having a pair of fixed terminals connected directly across the microphone terminals, and means connecting said output terminal to the amplifier load.

3. An amplifier as claimed in claim 1 wherein the capacitance of said capacitor is chosen so that the capacitor provides a low impedance path for said variable negative feedback signal.

4. An amplifier as claimed in claim 1 including an input stage and an output stage, said input stage comprising a first transistor having its base and emitter electrodes connected to said input terminals, said output stage comprising a second transistor having its collector connected to said output terminal, and DC circuit means connecting the collector of said first transistor to the base of said second transistor.

5. An amplifier as claimed in claim 4 wherein said DC circuit means includes a third transistor having its base directly connected to the collector of the first transistor and its collector directly connected to the base of the second transistor, and means directly connecting the emitter electrodes of said first, second and third transistors together.

6. A hearing aid comprising, a transistor input stage and a transistor output stage in cascade therewith, a microphone, a volume control potentiometer connected in parallel with said microphone, a capacitor, means connected said capacitor in series with said microphone across the input terminals of the transistor input stage, and a feedback circuit including a resistor connected between the output terminal of said output stage and the movable arm of said potentiometer which provides, at the input terminals, a DC negative feedback voltage and an AC negative feedback signal that varies in amplitude with the adjustment of the potentiometer arm.

7. A hearing aid as claimed in claim 6 wherein said input terminals comprise the base and emitter electrodes of the input transistor, and means directly connecting the output terminal to a load transducer.